United States Patent
Jang et al.

(10) Patent No.: US 9,284,484 B2
(45) Date of Patent: Mar. 15, 2016

(54) PROCESSES FOR SYNTHESIZING NANOCRYSTALS

(71) Applicant: SAMSUNG ELECTRONICS CO., LTD., Suwon-si, Gyeonggi-do (KR)

(72) Inventors: Hyo Sook Jang, Suwon-si (KR); Eun Joo Jang, Suwon-si (KR); Shin Ae Jun, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/296,658

(22) Filed: Jun. 5, 2014

(65) Prior Publication Data

US 2014/0361228 A1    Dec. 11, 2014

(30) Foreign Application Priority Data

Jun. 7, 2013    (KR) .................. 10-2013-0065491

(51) Int. Cl.
| | |
|---|---|
| *C09K 11/02* | (2006.01) |
| *C09K 11/62* | (2006.01) |
| *B82Y 40/00* | (2011.01) |
| *C30B 29/60* | (2006.01) |
| *C30B 7/14* | (2006.01) |
| *C30B 29/40* | (2006.01) |
| *C30B 29/48* | (2006.01) |

(Continued)

(52) U.S. Cl.
CPC . *C09K 11/02* (2013.01); *C30B 7/14* (2013.01); *C30B 29/40* (2013.01); *C30B 29/48* (2013.01); *C30B 29/60* (2013.01); *B82Y 40/00* (2013.01); *C09K 11/0805* (2013.01); *C09K 11/0811* (2013.01); *C09K 11/56* (2013.01); *C09K 11/62* (2013.01)

(58) Field of Classification Search
CPC .............. C09K 11/02; C09K 11/0805; C09K 11/0811; C09K 11/56; C09K 11/562; C09K 11/62; C09K 11/623; B82Y 30/00; B82Y 40/00
USPC ................. 252/301.36; 977/774; 428/403
See application file for complete search history.

(56) References Cited

U.S. PATENT DOCUMENTS

| | | | |
|---|---|---|---|
| 7,378,151 B2 | 5/2008 | Sato et al. | |
| 7,867,557 B2 | 1/2011 | Pickett et al. | |
| 8,247,073 B2 | 8/2012 | Jang et al. | |

(Continued)

FOREIGN PATENT DOCUMENTS

| | | |
|---|---|---|
| DE | 102009060835 A1 | 6/2011 |
| JP | 2004-243507 A | 9/2004 |

(Continued)

OTHER PUBLICATIONS

Newman et al., "Preparation of CdSe Quantum Dots in Ionic Liquids", Z. Phys. Chem., 220, 2006, pp. 1473-1481.

(Continued)

*Primary Examiner* — Khanh Tuan Nguyen
*Assistant Examiner* — Haidung Nguyen
(74) *Attorney, Agent, or Firm* — Cantor Colburn LLP

(57) ABSTRACT

A process of synthesizing nanocrystals, the process including: obtaining a metal precursor, a non-metal precursor, a ligand compound, and an ionic liquid; and contacting the metal precursor, the non-metal precursor, the ligand compound, and the ionic liquid to form a mixture and synthesize a first semiconductor nanocrystal.

15 Claims, 2 Drawing Sheets

(51) Int. Cl.
C09K 11/08 (2006.01)
C09K 11/56 (2006.01)

(56) References Cited

U.S. PATENT DOCUMENTS

| | | | |
|---|---|---|---|
| 8,357,308 B1 * | 1/2013 | Strouse et al. | 216/66 |
| 2007/0269991 A1 | 11/2007 | Jang et al. | |
| 2011/0108799 A1 | 5/2011 | Pickett et al. | |
| 2012/0205586 A1 * | 8/2012 | Ren et al. | 252/301.36 |
| 2012/0275991 A1 | 11/2012 | De Oliveira et al. | |
| 2013/0043210 A1 | 2/2013 | Strouse et al. | |

FOREIGN PATENT DOCUMENTS

| | | |
|---|---|---|
| JP | 2009-504422 A | 2/2009 |
| JP | 2009-097038 A | 5/2009 |
| KR | 1020070110995 A | 11/2007 |
| KR | 100853087 B1 | 8/2008 |
| KR | 1020110082452 A | 7/2011 |
| KR | 10-1124224 B1 | 2/2012 |
| KR | 1020120115347 A | 10/2012 |
| KR | 10-1233447 B1 | 2/2013 |
| WO | 2011079908 A1 | 7/2011 |

OTHER PUBLICATIONS

Korean Office Action for Korean Patent Application No. 10-2013-0065491 dated Jan. 9, 2015 with English Translation.

Lovingood et al., "Microwave Induced In-Situ Active Ion Etching of Growing InP Nanocrystals", Nano Letters, vol. 8, No. 10, 2008, pp. 3394-3397.

Virieux, et al., "InP/ZnS Nanocrystals: Coupling NMR and XPS for Fine Surface and Interface Description", Journal of the American Chemical Society, vol. 134, 2012, pp. 19701-19708.

Adam et al., "The effect of nanocrystal surface structure on the luminescence properties: Photoemission study of HF-etched InP nanocrystals", The Journal of Chemical Physics, vol. 123, 2005, pp. 084706-1-084706-10.

Choi et al., "Aqueous Synthesis of CdTe Quantum Dot Using Dithiol-Functionalized Ionic Liquid", Journal of Nanomaterials, vol. 2012, pp. 1-6.

Gerbec et al., "Microwave-Enhanced Reaction Rates for Nanoparticle Synthesis", J. Am. Chem. Soc., vol. 127, 2005, pp. 15791-15800.

Goharshadi et al., "Sonochemical synthesis and measurement of optical properties of zinc sulfide quantum dots", Chemical Engineering Journal, vol. 209, 2012, pp. 113-117.

Kloo et al., "Microwave assisted synthesis of ZnS quantum dots using ionic liquids", Material Letters, 89, 2012, pp. 316-319.

Talapin et al., "Etching of colloidal InP Nanocrystals with Fluorides: Photochemical Nature of the Process Resulting in High Photoluminescence Efficiency", J. Phys. Chem. B, vol. 106, 2002, pp. 12659-12663.

Xiao et al., "Microwave assisted fast and facile synthesis of SnO2 quantum dots and their printing applications", Chem. Commun., vol. 46, 2010, pp. 6509-6511.

* cited by examiner

PROCESSES FOR SYNTHESIZING NANOCRYSTALS

CROSS-REFERENCE TO RELATED APPLICATION

This application claims priority to and the benefit of Korean Patent Application No. 10-2013-0065491, filed on Jun. 7, 2013, and all the benefits accruing therefrom under 35 U.S.C. §119, the content of which is incorporated herein in its entirety by reference.

BACKGROUND

1. Field

A process for synthesizing nanocrystals is disclosed.

2. Description of the Related Art

Nanoparticles have drawn much attention due to the fact that unlike bulk materials, their physical characteristics (e.g., energy bandgap and melting point) may be controlled by changing the particle size. For example, a semiconductor nanocrystal (also known as a quantum dot) is a semiconductor material having a crystalline structure of a size of several nanometers. The semiconductor nanocrystal has a very small size so that it has a large surface area per unit volume and may exhibit a quantum confinement effect. Therefore, the semiconductor nanocrystal has different physicochemical characteristics than the bulk material. A quantum dot may absorb light from an excitation source to be excited to an excited state, and may emit energy corresponding to its energy bandgap. In the quantum dot, the energy bandgap may be adjusted by varying the size and/or the composition of the nanocrystal. In addition, the quantum dot may emit light with high color purity. Therefore, various applications of the semiconductor nanocrystal in a display element, an energy device, a bio-light emitting element, or the like have been researched.

A semiconductor nanocrystal (i.e., a quantum dot) may be synthesized by a vapor deposition method such as metal organic chemical vapor deposition ("MOCVD") and molecular beam epitaxy ("MBE"), or by a wet chemical method of adding a precursor to an organic solvent to grow nanocrystals. In the wet chemical method, an organic material such as a dispersant, is coordinated to a surface of the semiconductor crystal during the crystal growth to control the crystal growth. Therefore, the nanocrystals produced by the wet chemical method usually have a more uniform size and shape than those produced by the vapor deposition method.

A semiconductor nanocrystal for use in a device desirably has high quantum efficiency and high stability. However, when the semiconductor nanocrystal (e.g., a nanocrystal core) has a surface coordinated with an organic ligand without any shell layer, it tends to have many defects and/or traps, a very low level of light emitting efficiency, and insufficient stability (for example, the organic ligand may be easily removed, and this may cause oxidation of the nanocrystal). Passivation of the nanocrystal core with an inorganic shell may enhance the stability of the core and increase the efficiency due to the exciton confinement. In this regard, the differences in the crystal structures of the core/shell forming materials and the bandgap thereof may change the passivation degree and the shell quality, resulting in a difference in the efficiency of core/shell structures. Therefore, improvement of the shell passivation process may lead to improvements in the efficiency of the nanocrystals. Thus, an urgent need for technologies which enhance quality and yields of the core/shell nanocrystals remains.

SUMMARY

An embodiment provides a process for preparing semiconductor nanocrystal having improved quality at a high yield.

According to an embodiment, a process of synthesizing nanocrystals is provided, the process including:

preparing a mixture including a metal precursor, a non-metal precursor, a ligand compound, and an ionic liquid in an organic solvent; and heating the mixture to trigger a reaction between the metal precursor and the non-metal precursor in the mixture, thereby forming a first semiconductor nanocrystal.

The mixture may further include a second nanocrystal, and the heating the mixture to trigger the reaction between the metal precursor and the non-metal precursor may include forming a shell of the first semiconductor nanocrystal on a surface of the second nanocrystal to obtain a core-shell nanocrystal.

The organic solvent may be a hydrophobic solvent.

The hydrophobic solvent may be selected from a C6 to C22 primary alkyl amine, a C6 to C22 secondary alkyl amine, C6 to C40 tertiary alkyl amine, a heterocyclic compound having a nitrogen atom, a C6 to C40 aliphatic hydrocarbon, an aromatic hydrocarbon substituted with a C6 to C30 alkyl group, a phosphine substituted with a C6 to C22 alkyl group, a phosphine oxide substituted with a C6 to C22 alkyl group, a C12 to C22 aromatic ether, and a combination thereof.

The metal precursor may include a metal selected from a Group II metal, a Group III metal, a Group IV metal, and a combination thereof, and wherein the metal precursor is selected from a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, and a combination thereof. The non-metal precursor may be a compound including an element selected from a Group V element, a Group VI element, and a combination thereof.

The metal precursor may be selected from dimethyl zinc, diethyl zinc, zinc acetate, zinc acetylacetonate, zinc iodide, zinc bromide, zinc chloride, zinc fluoride, zinc carbonate, zinc cyanide, zinc nitrate, a zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bis(acetylacetonate), tin bromide, tin chloride, tin fluoride, tin oxide, tin sulfate, germanium tetrachloride, germanium oxide, germanium ethoxide, trimethyl gallium, triethyl gallium, gallium acetylacetonate, gallium-3-chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, thallium carbonate, and a combination thereof.

The non-metal precursor may be selected from hexanethiol, octanethiol, decanethiol, dodecanethiol, hexadecanethiol, mercaptopropylsilane, sulfur-trioctylphosphine (S-TOP), sulfur-tributylphosphine (S-TBP), sulfur-triphenylphosphine (S-TPP), sulfur-trioctylamine (S-TOA), trimethylsilylsulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, and a combination thereof.

The ligand compound may include a compound having a formula selected from $RCOOH$, $RNH_2$, $R_2NH$, $R_3N$, $RSH$, $R_3PO$, $R_3P$, $ROH$, and $RCOOR'$, and a combination thereof, wherein R and R' are each independently selected from a C1 to C24 alkyl group, a C2 to C24 alkenyl group, a C5 to C20 aryl group, and a combination thereof.

The ionic liquid may be selected from a substituted or unsubstituted imidazolium salt, a substituted or unsubstituted pyrazolium salt, a substituted or unsubstituted triazolium salt, a substituted or unsubstituted thiazolium salt, a substituted or unsubstituted oxazolium salt, a substituted or unsubstituted pyridazinium salt, a substituted or unsubstituted pyrimidinium salt, a substituted or unsubstituted ammonium salt, a substituted or unsubstituted phosphonium salt, a substituted or unsubstituted sulfonium salt, a substituted or unsubstituted pyridinium salt, a substituted or unsubstituted pyrrolidinium salt, and a combination thereof, and the ionic liquid may have a halide anion, tetrafluoroborate anion ($BF_4^-$), hexafluorophosphate anion ($PF_6^-$), perchlorate anion ($ClO_4^-$), acetate anion, trifluoroacetate anion, triflate anion, hydrogen sulfate anion, alkyl sulfate anion, sulphite anion, hydrogen sulphite anion, chloroaluminate anion, tetrabromoaluminate anion, nitrite anion, nitrate anion, dichlorocuprate anion, phosphate anion, hydrogen phosphate anion, dihydrogen phosphate anion, carbonate anion, hydrogen carbonate anion, sulfonate anion, tosylate anion, bis(trifluoromethyl sulphonyl)imide anion, or a combination thereof.

The amount of the ionic liquid may be less than or equal to about 40 volume percent, based on the total volume of the organic solvent.

The mixture may further include a protic solvent.

The protic solvent may be included in an amount of greater than or equal to about 0.01 times the total volume of the ionic liquid.

The protic solvent may be selected from an amine having 6 or more carbon atoms, an alcohol having 6 or more carbon atoms, and a combination thereof.

The amine may be selected from a monoamine, a diamine, a triamine, and a combination thereof, and the alcohol may be selected from a monoalcohol, a dialcohol, a trialcohol, a polyol, and a combination thereof.

The heating the mixture to trigger the reaction between the metal precursor and the non-metal precursor may include heating the mixture without irradiation of microwaves.

The heating may be carried out at a temperature of about 250° C. or less.

The core-shell nanocrystal may exhibit a quantum yield of about 50% or higher.

The foregoing process for preparing semiconductor nanocrystal makes it possible to control the growth of the inorganic shell and to achieve uniform growth of the shell, and thus core-shell nanocrystals having enhanced quantum yield may be synthesized at a higher yield.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
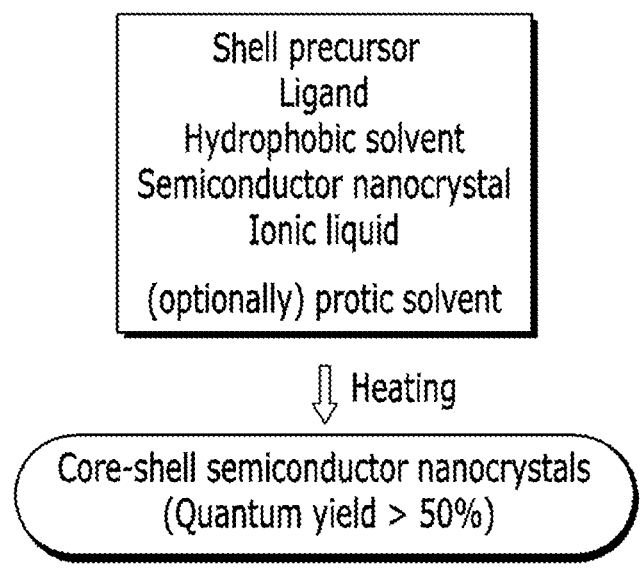
FIG. 1 illustrates a flow chart of an embodiment of a shell coating process.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the invention to those skilled in the art. Thus, in some exemplary embodiments, well known technologies are not specifically explained to avoid ambiguous understanding of the present invention. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise. Unless specified otherwise, the term "or" means "and/or."

"Alkyl" as used herein means a straight or branched chain, saturated, monovalent hydrocarbon group (e.g., methyl or hexyl).

"Aliphatic" means a saturated or unsaturated linear or branched hydrocarbon group. An aliphatic group may be an alkyl, alkenyl, or alkynyl group, for example.

"Aromatic" means an organic compound or group comprising at least one unsaturated cyclic group having delocalized pi electrons. The term encompasses both hydrocarbon aromatic compounds and heteroaromatic compounds.

"Hydrocarbon" means an organic compound having at least one carbon atom and at least one hydrogen atom, wherein one or more of the hydrogen atoms can optionally be substituted by a halogen atom (e.g., $CH_3F$, $CHF_3$ and $CF_4$ are each a hydrocarbon as used herein).

A process of synthesizing nanocrystals according to an embodiment includes:

preparing a mixture including a metal precursor, a non-metal precursor, a ligand compound, and an ionic liquid, in an organic solvent; and heating the mixture to trigger a reaction between the metal precursor and the non-metal precursor to form a first semiconductor nanocrystal. While not wanting to be bound by theory, it is understood that the first semiconductor nanocrystal is a reaction product of the metal precursor and the non-metal precursor, and thus the process is understood to include reacting the metal precursor and the non-metal precursor to form the first semiconductor nanocrystal.

The mixture may further include a second nanocrystal, and the heating the mixture to trigger the reaction between the metal precursor and the non-metal precursor may include forming a shell of the first semiconductor nanocrystal on a surface of the second nanocrystal to obtain a core-shell nanocrystal. While not wanting to be bound by theory, it is understood that the shell, which comprises the first semiconductor nanocrystal, is a reaction product of the metal precursor and the non-metal precursor. When the second nanocrystal has a core-shell structure, it is possible to produce a nanocrystal having a core-multishell structure.

Figure 2:
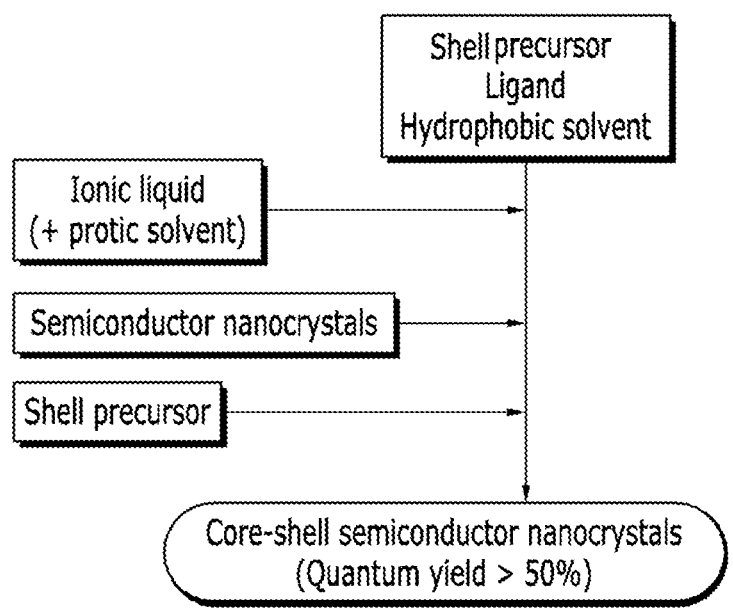
FIG. 2 is a flow chart of another embodiment of a shell coating process.

The preparing the mixture including the metal precursor, the non-metal precursor, the ligand compound, and the ionic liquid, in an organic solvent may be accomplished in any suitable manner, and is not particularly limited and may be chosen appropriately. In a non-limiting example, referring to FIG. 1, the mixture may be prepared by adding the metal precursor, the non-metal precursor, the ligand compound, the ionic liquid, and optionally the second nanocrystal, and/or the protic solvent (as will be further described below) in any suitable order or at the same time to the organic solvent. In a non-limiting example, referring to FIG. 2, the metal or the non-metal precursor and the ligand compound are dissolved in the organic solvent to prepare a solution, and then the ionic liquid, the metal or non-metal precursor, optionally the protic solvent, and optionally the second nanocrystal are added to this solution in any suitable order or simultaneously to obtain the mixture.

The organic solvent may be a hydrophobic solvent. For example, the hydrophobic solvent may be selected from a C6 to C22 primary alkyl amine such as hexadecyl amine; a C6 to C22 secondary alkyl amine such as dioctyl amine; a C6 to C40 tertiary alkyl amine such as trioctyl amine; a heterocyclic compound having a nitrogen atom such as pyridine; a C6 to C40 aliphatic hydrocarbon (e.g., an alkane, an alkene, or an alkyne) such as hexadecane, octadecane, octadecene, squalane, and the like; a C6 to C30 aromatic hydrocarbon such as phenyl dodecane, phenyl tetradecane, phenyl hexadecane, and the like; a phosphine substituted with a C6 to C22 alkyl group such as trioctyl phosphine; a phosphine oxide substituted with a C6 to C22 alkyl group such as trioctyl phosphine oxide; a C12 to C22 aromatic ether such as phenyl ether, benzyl ether, and the like; and a combination thereof. In an embodiment, the hydrophobic solvent may comprise a solvent selected from a C6 to C22 primary alkyl amine, a C6 to C22 secondary alkyl amine, a C6 to C40 tertiary alkyl amine, a phosphine substituted with a C6 to C22 alkyl group, a phosphine oxide substituted with a C6 to C22 alkyl group, and a combination thereof.

The metal precursor may be appropriately chosen depending on the type of the nanocrystal without any particular limitation. In a non-limiting example, the metal precursor may include a metal selected from a Group II metal, a Group III metal, a Group IV metal, and a combination thereof, and may be selected from a metal powder (e.g., elemental metal), an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, and a combination thereof. Examples of the metal precursor may include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, a zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bis(acetylacetonate), tin bromide, tin chloride, tin fluoride, tin oxide, tin sulfate, germanium tetrachloride, germanium oxide, germanium ethoxide, trimethyl gallium, triethyl gallium, gallium acetylacetonate, gallium-3-chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, and thallium carbonate. The metal precursor may be used alone or in a combination of at least two compounds depending on the composition of the nanocrystal intended to be synthesized.

The non-metal precursor may be appropriately chosen without any particular limitation depending on the type of the nanocrystal intended to be synthesized. In a non-limiting example, the non-metal precursor may be a compound including an element selected from a Group V element, a Group VI element, and a combination thereof. Examples of the non-metal precursor may include, but are not limited to, hexanethiol, octanethiol, decanethiol, dodecanethiol, hexadecanethiol, mercaptopropylsilane, sulfur-trioctylphosphine (S-TOP), sulfur-tributylphosphine (S-TBP), sulfur-triphenylphosphine (S-TPP), sulfur-trioctylamine (S-TOA), trimethylsilylsulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, and ammonium nitrate. The non-metal precursor may be used alone or in a combination of at least two compounds depending on the composition of the nanocrystal intended to synthesize.

In the mixture, and while not wanting to be bound by theory, the organic ligand compound is coordinated to the surface of the nanocrystals as prepared, plays a role of dispersing the nanocrystals in a solution, and may have an effect on the light-emitting and electrical characteristics of the nanocrystals. The ligand compound may be selected from a compound of the formula RCOOH, $RNH_2$, $R_2NH$, $R_3N$, RSH, $R_3PO$, $R_3P$, ROH, RCOOR', and a combination thereof, wherein R and R' are each independently a C1 to C24 alkyl group, a C1 to C24 alkenyl group, a C5 to C20 aryl group, and a combination thereof. Examples of the organic ligand compound may include, but are not limited to, methanethiol, ethanethiol, propanethiol, butanethiol, pentanethiol, hexanethiol, octanethiol, dodecanethiol, hexadecanethiol, octadecanethiol, benzylthiol, methaneamine, ethaneamine, propaneamine, butaneamine, pentaneamine, hexaneamine, octaneamine, dodecaneamine, hexadecylamine, octadecylamine, dimethylamine, diethylamine, dipropylamine, methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, a phosphine such as methylphosphine, ethylphosphine, propylphosphine, butylphosphine, pentylphosphine, and the like, a phosphine compound or oxide compound such as methylphosphine oxide, ethylphosphine oxide, propylphosphine oxide, butylphosphine oxide, and the like, a diphenylphosphine compound, a triphenylphosphine compound, an oxide compound thereof, and the like. The organic ligand compound may be used alone or in a combination thereof.

In the aforementioned process of synthesizing the nanocrystal, the metal precursor and the non-metal precursor may react in the presence of the ionic liquid to form a nanocrystal or a shell of a nanocrystal.

The ionic liquid is a salt in a liquid state and it comprises an ion and a counter ion thereto. In an embodiment, the ionic liquid may be selected from a substituted or unsubstituted imidazolium salt, a substituted or unsubstituted pyrazolium salt, a substituted or unsubstituted triazolium salt, a substituted or unsubstituted thiazolium salt, a substituted or unsubstituted oxazolium salt, a substituted or unsubstituted pyridazinium salt, a substituted or unsubstituted pyrimidinium salt, a substituted or unsubstituted ammonium salt, a substituted or unsubstituted phosphonium salt, a substituted or unsubstituted sulfonium salt, a substituted or unsubstituted pyridinium salt, a substituted or unsubstituted pyrrolidinium salt, and a combination thereof.

"Substituted," unless otherwise defined, means that the compound or group is substituted with at least one (e.g., 1, 2, 3, or 4) substituent independently selected from a hydroxyl (—OH), a C1-9 alkoxy, a C1-9 haloalkoxy, an oxo (=O), a nitro (—$NO_2$), a cyano (—CN), an amino (—$NH_2$), an azido (—$N_3$), an amidino (—C(=NH)$NH_2$), a hydrazino (—$NHNH_2$), a hydrazono (=N—$NH_2$), a carbonyl (—C(=O)—), a carbamoyl group (—C(O)$NH_2$), a sulfonyl (—S(=O)$_2$—), a thiol (—SH), a thiocyano (—SCN), a tosyl ($CH_3C_6H_4SO_2$—), a carboxylic acid (—C(=O)OH), a carboxylic C1 to C6 alkyl ester (—C(=O)OR wherein R is a C1 to C6 alkyl group), a carboxylic acid salt (—C(=O)OM) wherein M is an organic or inorganic anion, a sulfonic acid (—$SO_3H_2$), a sulfonic mono- or dibasic salt (—$SO_3$MH or —$SO_3M_2$ wherein M is an organic or inorganic anion), a phosphoric acid (—$PO_3H_2$), a phosphoric acid mono- or dibasic salt (—$PO_3$MH or —$PO_3M_2$ wherein M is an organic or inorganic anion), a C1 to C12 alkyl, a C3 to C12 cycloalkyl, a C2 to C12 alkenyl, a C5 to C12 cycloalkenyl, a C2 to C12 alkynyl, a C6 to C12 aryl, a C7 to C13 arylalkylene, a C4 to C12 heterocycloalkyl, and a C3 to C12 heteroaryl instead of hydrogen, provided that the substituted atom's normal valence is not exceeded.

The ionic liquid may comprise an anion selected from a halide anion such as $F^-$, a tetrafluoroborate anion ($BF_4^-$), a hexafluorophosphate anion ($PF_6^-$), a perchlorate anion ($ClO_4^-$), an acetate anion, a trifluoroacetate anion, a triflate anion, a hydrogen sulfate anion, an alkyl sulfate anion, a sulphite anion, a hydrogen sulphite anion, a chloroaluminate anion, a tetrabromoaluminate anion, a nitrite anion, a nitrate anion, a dichlorocuprate anion, a phosphate anion, a hydrogen phosphate anion, a dihydrogen phosphate anion, a carbonate anion, a hydrogen carbonate anion, a sulfonate anion, a tosylate anion, a bis(trifluoromethyl sulphonyl)imide anion and a combination thereof. In an embodiment, the ionic liquid may be selected from an imidazolium salt, a pyridinium salt, a phosphonium salt, an ammonium salt, and a combination thereof, and it may have $F^+$, $BF_4^-$, or $PF_6^-$ as an anion.

The ionic liquid may be used alone or in a combination of at least two salts.

The amount of the ionic liquid may be less than or equal to about 40 volume percent (vol %), for example, about 1 vol % to about 30 vol %, or about 5 vol % to about 20 vol %, based on the total volume of the organic solvent in the mixture. When being used in such an amount, the nanocrystal prepared therefrom may exhibit a higher level of quantum yield.

The mixture for the reaction may further include a protic solvent together with the ionic liquid. While not wanting to be bound by theory, it is understood that the presence of the protic solvent makes it possible to prepare a high quality nanocrystal even when the reaction is conducted at a lower temperature, and for example, in a shorter time. Without wishing to be bound by any theory, it is believed that the protic solvent may help the highly polar ionic liquid to be mixed well with the organic solvent in the mixture. In addition, it is believed that the protic solvent may control the decomposition rate of the ionic liquid and facilitate the transfer of the active chemical species. The amount of the protic solvent may be at least 0.01 times, for example about 0.1 to about 10 times, or about 0.1 times to about 1 times, the total volume of the ionic liquid. The protic solvent may be an amine having 6 or more carbon atoms, an alcohol having 6 or more carbon atoms, or a combination thereof. The amine may be a primary amine, a secondary amine, or a tertiary amine, and the alcohol may be a primary alcohol, a secondary alcohol, or a tertiary alcohol. The amine may be selected from a monoamine, a diamine, triamine, and a combination thereof, and the alcohol may be selected from a monoalcohol, a dialcohol, a trialcohol, a polyol, and a combination thereof. In a non-limiting example, the protic solvent may be selected from oleyl alcohol, dodecyl alcohol, oleyl amine, hexadecylamine, ethylene glycol, glycerol, and a combination thereof. In non-limiting examples, the protic solvent may be selected from alkylamine, phenylamine, benzylamine, diaminoalkane, phenylenediamine, dialkylenetriamine, polyetheramine, alkyl alcohol, aromatic alcohol, glycol, alkanediol, aromatic diol, glycerol, benzenetriol, alkanetriol, glycerin, pentaerythritol, polyether, polyester, and a combination thereof. The protic solvent may be a compound that has a boiling point greater than or equal to a process temperature.

In the mixture as obtained above, it is understood that a reaction occurs between the metal precursor and the non-metal precursor to form a first semiconductor nanocrystal. As set forth above, when the mixture includes a second semiconductor nanocrystal, the reaction between the metal precursor and the non-metal precursor allows formation of a shell of the first semiconductor nanocrystal on the surface of the second semiconductor nanocrystal, making it possible to obtain a nanocrystal of a core-shell structure. In an example, the reaction between the metal precursor and the non-metal precursor may be conducted by heating the mixture without irradiation of microwaves. The heating temperature may be appropriately chosen in light of the types of the precursor, the ionic liquids, the protic solvent, and the like. For example, the temperature may be less than or equal to about 350° C., e.g., about 300° C. or less, about 280° C. or less, about 240° C. or less, about 220° C. or less, or about 210° C. or less. For example, the temperature may be greater than or equal to about 150° C., greater than or equal to about 160° C., greater than or equal to about 170° C., greater than or equal to about 180° C., or greater than or equal to about 190° C., The first and second semiconductor nanocrystals may include a compound selected from a Group II-VI compound, a Group III-V compound, a Group IV-VI compound, a Group IV compound, a Group I-III-VI compound, and a combination thereof.

The Group II-VI compound may be selected from:
a binary element compound selected from CdSe, CdTe, ZnS, ZnSe, ZnTe, ZnO, HgS, HgSe, HgTe, MgSe, MgS, and a combination thereof;
a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and
a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound semiconductor may be selected from:
a binary element compound selected from GaN, GaP, GaAs, GaSb, AlN, AlP, AlAs, AlSb, InN, InP, InAs, InSb, and a combination thereof;
a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and
a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from:
a binary element compound selected from SnS, SnSe, SnTe, PbS, PbSe, PbTe, and a combination thereof;
a ternary element compound selected from SnSeS, SnSeTe, SnSTe, PbSeS, PbSeTe, PbSTe, SnPbS, SnPbSe, SnPbTe, and a combination thereof; and
a quaternary element compound selected from SnPbSSe, SnPbSeTe, SnPbSTe, and a combination thereof.

The Group IV compound may be a singular element compound selected from:
Si, Ge, and a combination thereof; and
a binary element compound selected from SiC, SiGe, and a combination thereof.

The semiconductor nanocrystal may include at least two kinds of compounds. The binary element compound, ternary element compound, or quaternary element compound may be present in a form of an alloy, or in a form of a structure wherein at least two different crystalline structures coexist as layers such as a core/shell or as compartments such as multipods.

The process of synthesizing nanocrystal may further include: adding a non-solvent to the thermal decomposition reaction product, and separating a nanocrystal to which the ligand compound is coordinated.

The non-solvent may be a polar solvent that may be mixed with the solvent used during the reaction, but is not capable of dispersing nanocrystals. The non-solvent may be selected depending on the types of the solvent which are suitable for use in the reaction, and may be selected from, for example, acetone, ethanol, butanol, isopropanol, ethanediol, water, tetrahydrofuran ("THF"), dimethyl sulfoxide ("DMSO"), diethylether, formaldehyde, acetaldehyde, ethylene glycol, a solvent having a similar solubility parameter to the foregoing solvent, and a combination thereof. The separation may be performed using centrifugation, precipitation, chromatography, or distillation. The separated nanocrystals may be added into a washing solvent as needed. The washing solvent is not particularly limited, and may be a solvent having a similar solubility parameter to the ligand, for example hexane, heptane, octane, chloroform, toluene, benzene, and the like.

The nanocrystal prepared in accordance with the aforementioned process may exhibit a quantum yield of greater than or equal to about 50%. The semiconductor nanocrystal compositions may find their utility in various fields such as a light emitting diode ("LED"), a solar cell, and a biosensor.

Hereinafter, the present invention is illustrated in more detail with reference to specific examples. However, they are exemplary embodiments of the present invention, and the present invention is not limited thereto.

EXAMPLES

Example 1

Shell Coating Using an Ionic Liquid (bmim.BF$_4$) and a Protic Solvent (Oleyl Alcohol) [InP/ZnS Core/Shell Nanocrystal]

0.2 millimole (mmol) of indium acetate, 0.6 mmol of palmitic acid, and 10 milliliters (mL) of octadecene are put into a reactor and heated to 120° C. for a period of one hour. Then, the atmosphere in the reactor is replaced with nitrogen gas, the reactor is heated to 280° C., and 0.1 mmol of tris(trimethylsilyl)phosphine (TMS3P) is injected therein, and the reaction is allowed to proceed for 40 minutes. The reaction solution thus obtained is cooled to room temperature and acetone is added thereto to precipitate InP nanocrystals. The InP nanocrystals thus obtained are separated by centrifugation and dispersed again in toluene.

0.3 mmol of zinc acetate, 0.6 mmol of oleic acid (OA), and 10 mL of trioctylamine (TOA) are added to a reactor and heated to 120° C. until the precursors are completely dissolved. Then, the reactor is cooled to room temperature and the atmosphere in the reactor is replaced with nitrogen gas. The InP nanocrystals (optical density (OD)×volume of nanocrystal dispersion (mL) (hereinafter, "OD×mL")=0.15), 0.6 mmol of 0.4 molar (M) sulfur-trioctylphosphine (S/TOP), 1 mL of 1-butyl-3-methyl imidazolium tetrafluoroborate (hereinafter, bmim.BF$_4$), and 0.1 mL of oleyl alcohol are added to the solution obtained above, and the resulting mixture is heated to 300° C. After the reaction proceeds at a temperature of 300° C. for 45 minutes, ethanol is added to the reaction product, the nanocrystals being precipitated are separated via centrifugation, and the separated nanocrystals are dispersed again in toluene. The maximum light emitting peak of photoluminescence (PL), the full width at half maximum, and the quantum yield of the nanocrystals thus obtained are summarized in Table 1 below. The ratio of Zn/In is calculated from the results of inductively coupled plasma atomic emission spectroscopy (ICP-AES), and the result is also summarized in Table 1.

Example 2

Shell Coating Using an Ionic Liquid (bmim.BF$_4$) [InP/ZnS Core/Shell Nanocrystal]

InP/ZnS nanocrystals are synthesized in the same manner as set forth in Example 1, except that oleyl alcohol is not used. The maximum light emitting peak wavelength (PL), the full width at half maximum, and the quantum yield of the nanocrystals thus obtained are summarized in Table 1 below.

Comparative Example 1

Shell Coating without Using an Ionic Liquid and a Protic Solvent [InP/ZnS Core/Shell Nanocrystal]

InP/ZnS nanocrystals are synthesized in the same manner as set forth in Example 1, except for not using 1-butyl-3-methyl imidazolium tetrafluoroborate and oleyl alcohol. The maximum light emitting peak wavelength (PL), the full width at half maximum, and the quantum yield of the nanocrystals thus obtained are summarized in Table 1 below. The ratio of Zn/In is calculated from the results of the ICP-AES, and the result is also summarized in Table 1.

Example 3

Shell Coating Using an Ionic Liquid (hmim.PF$_6$) and a Protic Solvent (Oleyl Amine) [InP/ZnS Core/Shell Nanocrystal]

0.3 mmol of zinc acetate, 0.6 mmol of oleic acid (OA), and 10 mL of trioctylamine (TOA) are added to a reactor and heated to 120° C. until the precursors are completely dissolved. Then, the reactor is cooled to room temperature and the atmosphere in the reactor is replaced with nitrogen gas. The InP nanocrystals (OD×mL=0.15), 0.6 mmol of 0.4 M S/TOP, 1 mL of 1-hexyl-3-methyl imidazolium hexafluoroborate (hereinafter, hmim.PF$_6$), and 0.1 mL of oleyl alcohol are added to the solution obtained above, and the resulting mixture is heated to 250° C. After the reaction proceeds at a temperature of 250° C. for 20 minutes, the reaction product is cooled to room temperature, ethanol is added thereto, the nanocrystals being precipitated are separated via centrifugation, and the separated nanocrystals are dispersed again in toluene. The maximum light emitting peak of photoluminescence (PL), the full width at half maximum, and the quantum yield of the nanocrystals thus obtained are summarized in Table 1 below.

TABLE 1

| Sample (reaction conditions) | Ionic liquid | Protic solvent | PL (FWHM) unit: nm | QY (%) | Zn/In |
|---|---|---|---|---|---|
| Example 1 (300° C. 45 min) | Bmim.BF$_4$ | Oleyl alcohol | 605 (54) | 55% | |
| Example 2 (300° C. 45 min) | Bmim.BF$_4$ | — | 589 (47) | 60% | 4.5 |
| Example 3 (250° C. 20 min) | Hmim.PF$_6$ | Oleyl alcohol | 597 (56) | 56% | |
| Comparative Example 1 (300° C. 45 min) | — | — | 600 (53) | 43% | 4.2 |

FWHM is full width at half maximum,
QY is quantum yield

As can be seen from the results shown in Table 1, the nanocrystals synthesized in the presence of the ionic liquid (bmim.BF$_4$ or hmim.PF$_6$) exhibit enhanced quantum yield and the coated amount (i.e., the amount of the shell material) may be slightly increased.

Examples 4 and 5 and Comparative Example 2

Synthesis of InP/ZnS at a Low Temperature

Except for changing the reaction conditions as set forth in Table 2, InP/ZnS nanocrystals are synthesized in the same manner set forth in Example 1. The maximum light emitting peak wavelength and the quantum yield of the nanocrystals thus obtained are summarized in Table 2 below.

TABLE 2

| Sample | Bmim.BF$_4$ | Oleyl alcohol | Reaction temperature/time | PL (FWHM) unit: nm | QY (%) |
|---|---|---|---|---|---|
| Comparative Example 2 | X | X | 200° C./10 min | 589 (53) | 15 |
| Example 5 | ◯ | X | 200° C./10 min | 589 (54) | 27 |
| | ◯ | X | 200° C./40 min | 590 (54) | 36 |
| Example 4 | ◯ | ◯ | 200° C./10 min | 597 (55) | 42 |
| | ◯ | ◯ | 200° C./40 min | 593 (54) | 51 |

From the results of Table 2, it is confirmed that in the process being conducted at a low temperature of 200° C., the nanocrystals prepared in the presence of the ionic liquid and the protic solvent may exhibit the highest quantum yield. In addition, the results confirm that additionally using the protic solvent allows to achievement of a high quantum yield of greater than or equal to about 50% even when the reaction proceeds at a temperature of about 200° C. for about 30 minutes.

Example 6

Changes in the Efficiency of the Nanocrystals Depending on the Amount of the Ionic Liquid Except for using the amount of bmim.BF$_4$ as set forth in Table 3, the nanocrystals (InP/ZnS) are synthesized in the same manner as set forth in Example 1. The maximum light emitting peak wavelength and the quantum yield of the nanocrystals thus obtained are summarized in Table 3 below.

TABLE 3

| Amount (%) of Bmim.BF$_4$ based on the amount of TOA | Maximum light emitting peak wavelength (FWHM) | QY |
|---|---|---|
| 0 | 620 (59) | 39 |
| 5% (0.22 mL) | 604 (51) | 58 |
| 10% (0.43 mL) | 615 (53) | 61 |
| 25% (1.1 mL) | 604 (51) | 55 |
| 50% (2.2 mL) | 604 (53) | 49 |

From the results of Table 3, comparing use of bmim.BF$_4$, the nanocrystals prepared using bmim.BF$_4$ in an amount of 10% relative to the amount of the solvent may exhibit a quantum yield of 1.6 times that of the nanocrystals prepared by not using bmim.BF$_4$.

Example 7

Shell Coating Using an Ionic Liquid (bmim.BF$_4$) [InP/ZnSeS Core/Shell Nanocrystal]

0.3 mmol of zinc acetate, 0.6 mmol of oleic acid (OA), and 10 mL of trioctylamine (TOA) are added to a reactor and heated to 120° C. until the precursors are completely dissolved. Then, the reactor is cooled to room temperature and the atmosphere in the reactor is replaced with nitrogen gas. The InP nanocrystals (OD×mL=0.15), 0.6 mmol of 0.4 M S/TOP, and 1 mL of 1-butyl-3-methyl imidazolium tetrafluoroborate (hereinafter, bmim.BF$_4$) are added to the solution obtained above, and the resulting mixture is heated to 300° C. After the reaction proceeds at a temperature of 300° C. for 45 minutes, the reaction product is cooled to room temperature and ethanol is added thereto, the nanocrystals being precipitated are separated via centrifugation, and the separated nanocrystals are dispersed again in toluene. The maximum light emitting peak wavelength, the full width at half maximum, and the quantum yield of the nanocrystals thus obtained are summarized in Table 4 below.

Comparative Example 3

Shell Coating without Using an Ionic Liquid and a Protic Solvent [InP/ZnSeS Core/Shell Nanocrystal]

InP/ZnSeS nanocrystals are synthesized in the same manner as set forth in Example 7, except that bmim.BF$_4$ is not used and the reaction between the precursors for the shell is conducted at a temperature of 280° C. for 2 hours. The maximum light emitting peak wavelength, the full width at half maximum, and the quantum yield of the nanocrystals thus obtained are summarized in Table 4 below.

TABLE 4

| Sample | Bmim.BF$_4$ | PL (FWHM) unit: nm | QY (%) |
|---|---|---|---|
| Example 7 | ○ | 633 (48) | 56 |
| Comparative Example 3 | X | 632 (56) | 46 |

The results of Table 4 confirm that the shell coating prepared by using the ionic liquid may exhibit a higher quantum yield.

Example 8

Shell Coating Using an Ionic Liquid (bmim.BF$_4$) [InP/ZnSeS/ZnS]

0.3 mmol of zinc acetate, 0.6 mmol of oleic acid (OA), and 10 mL of trioctylamine (TOA) are added to a reactor and heated to 120° C. until the precursors are completely dissolved. Then, the reactor is cooled to room temperature and the atmosphere in the reactor is replaced with nitrogen gas. The InZnP/ZnSeS nanocrystals (OD×mL=0.15), 0.6 mmol of 0.4 M S/TOP, and 1 mL of 1-butyl-3-methyl imidazolium tetrafluoroborate (hereinafter, bmim.BF$_4$) are added to the solution obtained above, and the resulting mixture is heated to 300° C. After the reaction proceeds at a temperature of 300° C. for 45 minutes, the reaction product is cooled to room temperature and ethanol is added thereto, the nanocrystals being precipitated are separated via centrifugation, and the separated nanocrystals are dispersed again in toluene. The maximum light emitting peak wavelength (PL), the full width at half maximum, and the quantum yield of the nanocrystals thus obtained are summarized in Table 5 below.

Comparative Example 4

Shell Coating without Using an Ionic Liquid (bmim.BF$_4$) [InP/ZnSeS/ZnS]

InP/ZnSeS/ZnS nanocrystals are synthesized in the same manner as set forth in Example 8, except that bmim.BF$_4$ is not used. The maximum light emitting peak wavelength, the full width at half maximum, and the quantum yield of the nanocrystals thus obtained are summarized in Table 5 below.

TABLE 5

| Sample | Bmim.BF$_4$ | Oleyl alcohol | PL (FWHM) unit: nm | QY (%) |
|---|---|---|---|---|
| Example 8 | ○ | X | 537 (41) | 90 |
| Comparative Example 4 | X | X | 536 (40) | 69 |

The results of Table 5 confirm that when the shell coating is prepared in the presence of the ionic liquid, the nanocrystals being prepared may exhibit a significantly increased quantum yield.

Example 9

Preparation of InZnP Core Using the Ionic Liquid, bmim.BF$_4$ 0.2 mmol of indium acetate, 0.1 mmol of zinc stearate, 0.6 mmol of palmitic acid, and 10 mL of octadecene (ODE) are added to a reactor and heated to 120° C. under vacuum. After one hour, the atmosphere in the reactor is replaced with nitrogen gas. The reactor is heated to 280° C., and 0.5 mL of bmim.BF$_4$ and 0.1 mmol of tris(trimethylsilyl)phosphine (TMS3P) are injected into the reactor and the reaction proceeds for 20 minutes. The resulting solution is cooled to room temperature and acetone is added thereto, the nanocrystals being precipitated are separated via centrifugation, and the separated nanocrystals are dispersed in toluene. On the UV absorption spectrum of the InP nanocrystal thus prepared, the first absorption maximum wavelength (from the long wavelength) is about 472 nm. The longer this wavelength is, the narrower the bandgap of the nanocrystals and the smaller the size thereof may be.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A process of synthesizing nanocrystals, the process comprising:
   preparing a mixture comprising a metal precursor, a non-metal precursor, a ligand compound, and an ionic liquid, in an organic solvent; and
   heating the mixture to trigger a reaction between the metal precursor and the non-metal precursor, thereby forming a first semiconductor nanocrystal, and
   wherein the mixture further comprises a second nanocrystal, and the heating the mixture to trigger the reaction between the metal precursor and the non-metal precursor comprises forming a shell of the first semiconductor nanocrystal on a surface of the second nanocrystal to obtain a core-shell nanocrystal.

2. The process of claim 1, wherein the organic solvent is a hydrophobic solvent.

3. The process of claim 2, wherein the hydrophobic solvent is selected from a C6 to C22 primary alkyl amine, a C6 to C22 secondary alkyl amine, C6 to C40 tertiary alkyl amine, a heterocyclic compound having a nitrogen atom, a C6 to C40 aliphatic hydrocarbon, an aromatic hydrocarbon substituted with a C6 to C30 alkyl group, a phosphine substituted with a C6 to C22 alkyl group, a phosphine oxide substituted with a C6 to C22 alkyl group, a C12 to C22 aromatic ether, and a combination thereof.

4. The process of claim 1, wherein the metal precursor comprises a metal selected from a Group II metal, a Group III metal, a Group IV metal, and a combination thereof, and wherein the metal precursor is selected from a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, and a combination thereof, and
   wherein the non-metal precursor is a compound comprising an element selected from a Group V element, a Group VI element, and a combination thereof.

5. The process of claim 4, wherein the metal precursor is selected from dimethyl zinc, diethyl zinc, zinc acetate, zinc acetylacetonate, zinc iodide, zinc bromide, zinc chloride, zinc fluoride, zinc carbonate, zinc cyanide, zinc nitrate, a zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bis(acetylacetonate), tin bromide, tin chloride, tin fluoride, tin oxide, tin sulfate, germanium tetrachloride, germanium oxide, germanium ethoxide, trimethyl gallium, triethyl gallium, gallium acetylacetonate, gallium-3-chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, thallium carbonate, and a combination thereof, and
   the non-metal precursor is selected from hexanethiol, octanethiol, decanethiol, dodecanethiol, hexadecanethiol, mercaptopropylsilane, sulfur-trioctylphosphine, sulfur-tributylphosphine, sulfur-triphenylphosphine, sulfur-trioctylamine, trimethylsilylsulfur, ammonium sulfide, sodium sulfide, selenium-trioctylphosphine, selenium-tributylphosphine, selenium-triphenylphosphine, tellurium-tributylphosphine, tellurium-triphenylphosphine, tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, and a combination thereof.

6. The process of claim 1, wherein the ligand compound comprises a compound having a formula selected from RCOOH, $RNH_2$, $R_2NH$, $R_3N$, RSH, $R_3PO$, $R_3P$, ROH, and RCOOR', and a combination thereof, wherein R and R' are each independently selected from a C1 to C24 alkyl group, a C5 to C20 aryl group, and a combination thereof.

7. The process of claim 1, wherein the ionic liquid is selected from a substituted or unsubstituted imidazolium salt, a substituted or unsubstituted pyrazolium salt, a substituted or unsubstituted triazolium salt, a substituted or unsubstituted thiazolium salt, a substituted or unsubstituted oxazolium salt, a substituted or unsubstituted pyridazinium salt, a substituted or unsubstituted pyrimidinium salt, a substituted or unsubstituted ammonium salt, a substituted or unsubstituted phosphonium salt, a substituted or unsubstituted sulfonium salt, a substituted or unsubstituted pyridinium salt, a substituted or unsubstituted pyrrolidinium salt, and a combination thereof,
   wherein the ionic liquid comprises a halide anion, tetrafluoroborate anion, hexafluorophosphate anion, perchlorate anion, acetate anion, trifluoroacetate anion, triflate anion, hydrogen sulfate anion, alkyl sulfate anion, sulphite anion, hydrogen sulphite anion, chloroaluminate anion, tetrabromoaluminate anion, nitrite anion, nitrate anion, dichlorocuprate anion, phosphate anion, hydrogen phosphate anion, dihydrogen phosphate anion, carbonate anion, hydrogen carbonate anion, sulfonate anion, tosylate anion, bis(trifluoromethyl sulphonyl)imide anion, or a combination thereof.

8. The process of claim 1, wherein an amount of the ionic liquid is less than or equal to about 40 volume percent, based on a total volume of the organic solvent.

9. The process of claim 1, wherein the mixture further comprises a protic solvent.

10. The process of claim 9, wherein the protic solvent is included in an amount of greater than or equal to about 0.01 times a total volume of the ionic liquid.

11. The process of claim 9, wherein the protic solvent is selected from an amine having 6 or more carbon atoms, an alcohol having 6 or more carbon atoms, and a combination thereof.

12. The process of claim 11, wherein the amine is selected from a monoamine, a diamine, a triamine, and a combination thereof, and wherein the alcohol is selected from a monoalcohol, a dialcohol, a trialcohol, a polyol, and a combination thereof.

13. The process of claim 1, wherein the heating the mixture comprises heating the mixture without irradiation of microwaves.

14. The process of claim 13, wherein the heating comprises heating at a temperature of about 250° C. or less.

15. The process of claim 1, wherein the core-shell nanocrystal has a quantum yield of about 50% or higher.

* * * * *